(12) United States Patent
Steigerwald et al.

(10) Patent No.: US 9,972,541 B2
(45) Date of Patent: May 15, 2018

(54) TECHNIQUE FOR FILLING HIGH ASPECT RATIO, NARROW STRUCTURES WITH MULTIPLE METAL LAYERS AND ASSOCIATED CONFIGURATIONS

(71) Applicant: Intel Corporation, Santa Clara, CA (US)

(72) Inventors: Joseph M. Steigerwald, Forest Grove, OR (US); Nick Lindert, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/328,473

(22) PCT Filed: Aug. 29, 2014

(86) PCT No.: PCT/US2014/053535
§ 371 (c)(1),
(2) Date: Jan. 23, 2017

(87) PCT Pub. No.: WO2016/032528
PCT Pub. Date: Mar. 3, 2016

(65) Prior Publication Data
US 2017/0213768 A1    Jul. 27, 2017

(51) Int. Cl.
*H01L 21/8234* (2006.01)
*H01L 27/088* (2006.01)
(Continued)

(52) U.S. Cl.
CPC .... *H01L 21/823475* (2013.01); *H01L 21/304* (2013.01); *H01L 21/3085* (2013.01);
(Continued)

(58) Field of Classification Search
CPC ......... H01L 21/823475; H01L 27/0886; H01L 29/41791; H01L 29/66795; H01L 23/535;
(Continued)

(56) References Cited

U.S. PATENT DOCUMENTS 7,282,766 B2 * 10/2007 Okuno .............. H01L 29/41791
257/347
7,968,394 B2 * 6/2011 Orlowski .......... H01L 29/41791
438/197

(Continued)

OTHER PUBLICATIONS

International Search Report and Written Opinion dated May 27, 2015, issued in corresponding International Application No. PCT/US2014/053535, 12 pages.

*Primary Examiner* — William Coleman
(74) *Attorney, Agent, or Firm* — Schwabe, Williamson & Wyatt, P.C.

(57) ABSTRACT

Embodiments of the present disclosure describe techniques for filling a high aspect ratio, narrow structure with multiple metal layers and associated configurations. In one embodiment, an apparatus includes a transistor structure comprising a semiconductor material, a dielectric material having a recess defined over the transistor structure, the recess having a height in a first direction, an electrode terminal disposed in the recess and coupled with the transistor structure, wherein a first portion of the electrode terminal comprises a first metal in direct contact with the transistor structure and a second portion of the electrode terminal comprises a second metal disposed on the first portion and wherein an interface between the first portion and the second portion is planar and extends across the recess in a second direction that is substantially perpendicular to the first direction. Other embodiments may be described and/or claimed.

20 Claims, 5 Drawing Sheets

(51) Int. Cl.
- *H01L 29/417* (2006.01)
- *H01L 29/78* (2006.01)
- *H01L 21/304* (2006.01)
- *H01L 21/308* (2006.01)
- *H01L 23/535* (2006.01)
- *H01L 29/66* (2006.01)

(52) U.S. Cl.
CPC .... *H01L 21/823431* (2013.01); *H01L 23/535* (2013.01); *H01L 27/0886* (2013.01); *H01L 29/41791* (2013.01); *H01L 29/66795* (2013.01); *H01L 29/785* (2013.01)

(58) Field of Classification Search
CPC . H01L 21/3085; H01L 21/304; H01L 29/785; H01L 21/823431

See application file for complete search history.

(56) References Cited

U.S. PATENT DOCUMENTS

| | | | | |
|---|---|---|---|---|
| 9,059,164 | B2* | 6/2015 | Cheng | H01L 29/511 |
| 9,087,886 | B2* | 7/2015 | Kim | H01L 21/02697 |
| 9,142,651 | B1* | 9/2015 | Xie | H01L 29/66818 |
| 9,282,273 | B2* | 3/2016 | Lockett | H04N 5/4403 |
| 9,412,822 | B2* | 8/2016 | Cai | H01L 29/1054 |
| 9,478,636 | B2* | 10/2016 | Chen | H01L 21/76819 |
| 9,515,163 | B2* | 12/2016 | Xie | |
| 9,634,013 | B2* | 4/2017 | Liaw | H01L 27/1104 |
| 2008/0099921 | A1* | 5/2008 | Katata | H01L 21/76877 257/751 |
| 2008/0237675 | A1 | 10/2008 | Doyle et al. | |
| 2011/0291166 | A1 | 12/2011 | Booth, Jr. et al. | |
| 2011/0298025 | A1 | 12/2011 | Haensch et al. | |
| 2012/0091538 | A1 | 4/2012 | Lin et al. | |
| 2013/0113073 | A1 | 9/2013 | Liu et al. | |
| 2015/0311343 | A1* | 10/2015 | Chowdhury | H01L 29/7851 257/401 |
| 2016/0049487 | A1* | 2/2016 | Xu | H01L 29/41791 257/288 |

* cited by examiner

US 9,972,541 B2

TECHNIQUE FOR FILLING HIGH ASPECT RATIO, NARROW STRUCTURES WITH MULTIPLE METAL LAYERS AND ASSOCIATED CONFIGURATIONS

CROSS-REFERENCE TO RELATED APPLICATION

The present application is a national phase entry under 35 U.S.C. § 371 of International Application No. PCT/US2014/053535, filed Aug. 29, 2014, entitled "TECHNIQUE FOR FILLING HIGH ASPECT RATIO, NARROW STRUCTURES WITH MULTIPLE METAL LAYERS AND ASSOCIATED CONFIGURATIONS," which designates the United States of America, the entire disclosure of which is hereby incorporated by reference in its entirety and all purposes.

FIELD

Embodiments of the present disclosure generally relate to the field of integrated circuits, and more particularly, to techniques for filling high aspect ratio, narrow structures with multiple metal layers and associated configurations.

BACKGROUND

Dimensions of transistor structures continue to shrink to smaller sizes in emerging technologies. For example, a critical dimension of metal contacts that deliver electrical energy to transistor structures may be shrinking to a degree where conventional techniques for depositing metal in the narrow structures may not be feasible for technical or cost reasons.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
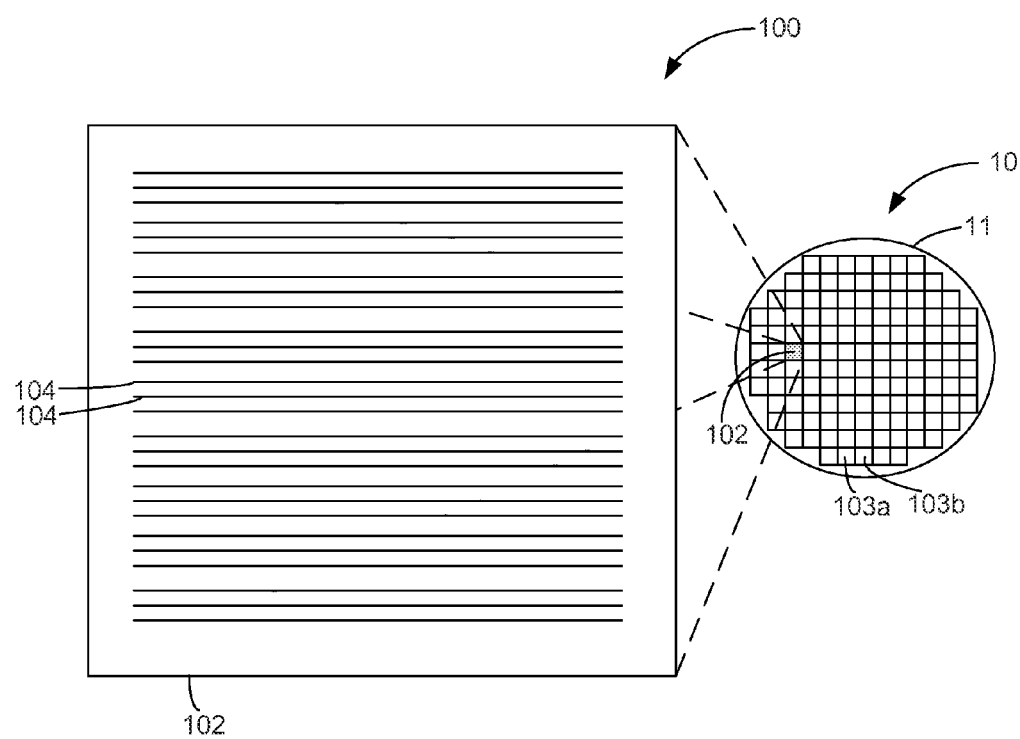
FIG. 1 schematically illustrates a top view of an example die in wafer form and in singulated form, in accordance with some embodiments.

Embodiments of the present disclosure describe techniques for filling a high aspect ratio, narrow structure with multiple metal layers and associated configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more transistor electrode assemblies (e.g., transistor electrode assembly 300a-b of FIG. 3 or 400a-b of FIGS. 4A-G) as described herein. For example, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
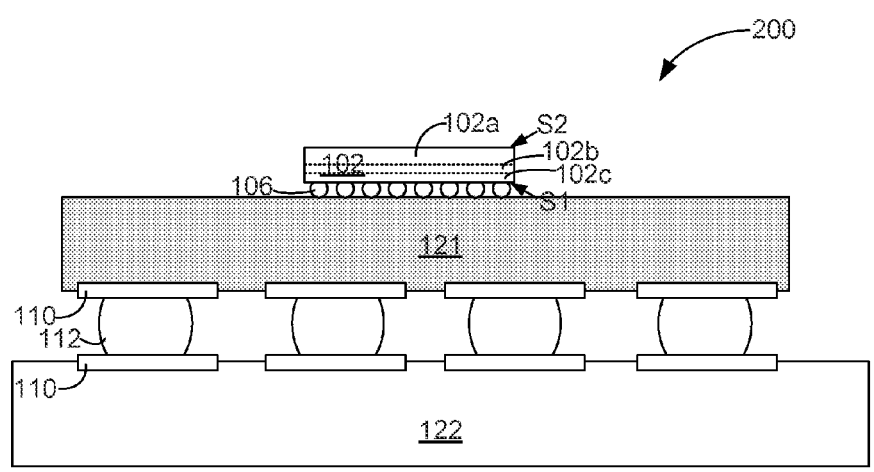
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an integrated circuit (IC) assembly 200 may include one or more of the die 102, package substrate 121 and/or circuit board 122, according to various embodiments. Embodiments described herein for a transistor electrode assembly may be implemented in any suitable IC device according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 602 of FIG. 6).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
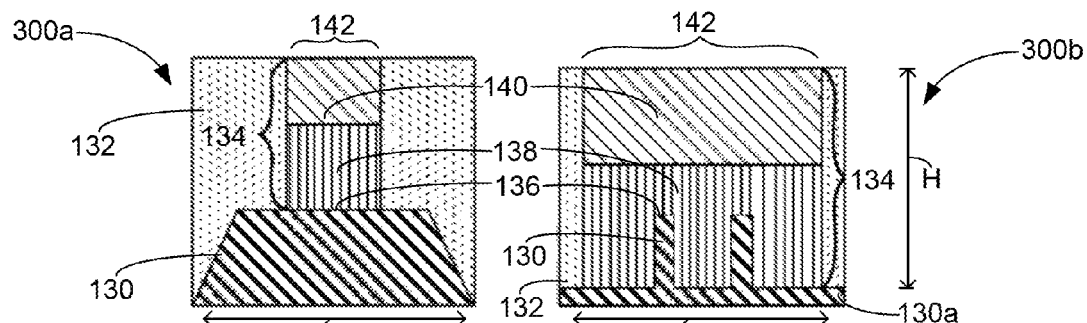
FIG. 3 schematically illustrates a cross-section side view of a transistor electrode assembly from a first perspective and a second perspective, in accordance with some embodiments.

FIG. 3 schematically illustrates a cross-section side view of a transistor electrode assembly 300a from a first perspective and the transistor electrode assembly 300b from a second perspective, in accordance with some embodiments. For example, the transistor electrode assembly 300a may be a cross-section depiction along and parallel to a lengthwise direction, L, of one or more fin structures (e.g., transistor structure 130) and the transistor electrode assembly 300b may be a cross-section depiction across and perpendicular to the lengthwise direction of the one or more fin structures (e.g., transistor structure 130) in direction W.

According to various embodiments, the transistor electrode assembly 300a, 300b includes a transistor structure 130, a dielectric material 132 disposed on the transistor structure 130 and having a recess 134 defined over the transistor structure 130, and an electrode terminal 142 disposed in the recess 134 and coupled with the transistor structure 130. The electrode terminal 142 may include a first portion 138 in direct contact with the transistor structure 130 and a second portion 140 disposed on the first portion 138, as can be seen.

The first portion 138 may include, for example, one or more metals deposited on the transistor structure 130. For example, the first portion 138 may include an interface metal that is in direct contact with the transistor structure 130. In an embodiment where the transistor structure 130 is a gate of a transistor, the interface metal may be a workfunction metal (WFM) having a thickness that is configured to set a threshold voltage ($V_{TH}$) in a channel of the transistor. In an embodiment where the transistor structure 130 is a source or drain region of a transistor, the interface metal may be a contact metal. In other embodiments, the first portion 138 and second portion 140 may be configured to serve other functions. For example, the first portion 138 may be a conductor metal and the second portion 140 may be a workfunction metal, in some embodiments.

In the depicted embodiment, the transistor structure 130 is a gate having a gate dielectric 136 (darker line) disposed on the transistor structure 130 and, in some cases, on sidewalls of the dielectric material 132 in the recess 134, as can be seen. Although the depicted embodiment shows a case where an electrode terminal 142 is formed on a gate, similar principles or configurations may be used to form an electrode terminal 142 on a source/drain region of a transistor in other embodiments. For example, source/drain contacts may be formed on opposing sides of the electrode terminal 142 of a gate using similar principles described in connection with forming of the electrode terminal 142 in FIGS. 4A-G.

The transistor structure 130 (e.g., gate or source/drain) may be composed of any suitable material including a semiconductor material such as, for example, silicon. In the depicted embodiment, the transistor structure 130 includes one or more fin structures. The one or more fin structures may generally extend in a lengthwise direction L and may be formed from a semiconductor material of a semiconductor substrate 130a in the fabrication of one or more fin-FET (field-effect transistor) devices such as dual-gate, tri-gate or other fin-based transistors.

The metal(s) may be deposited to form the first portion 138 in a manner that provides a substantially planar interface at a top surface that is in direct contact with material of the second portion 140, as can be seen. That is, the planar interface between the first portion 138 and the second portion 140 may extend across the entire recess 134 in directions, L and/or W, indicated by the arrows. The recess 134 may have a height, H, and the first portion 138 may fill only a portion of the height H of the recess 134, as can be seen. In some embodiments, the first portion 138 covers surfaces of the transistor structure 130 including the fin structures within the recess 134, as can be seen. Techniques for depositing one or more metals to form the first portion 138 are further described in connection with FIGS. 4A-G.

An aspect ratio may be defined by a ratio of the height, H, of the recess 134 or electrode terminal 142 relative to another dimension of the recess 134 or electrode terminal that is perpendicular to the height H such as, for example, a critical dimension (CD) of the recess 134 or electrode terminal 142. Thus, a narrower CD may provide a higher aspect ratio. The CD of the narrow recess 134 or electrode terminal 142 may be 15 nanometers (nm) or less in some embodiments. As CD of the recess 134 or electrode terminal 142 continues to shrink, filling the recess 134 with metal to form the first portion 138 and the second portion 140 may become more challenging. In some embodiments, the aspect ratio may be greater than or equal to 1 (1:1). In one embodiment, an aspect ratio of the height of the recess relative to the critical dimension is greater than or equal to 2:1. While the techniques herein may be particularly well-suited for filling narrow CD structures, the techniques may be used for filling wider CD structures (e.g., CD greater than 15 nm) according to various embodiments.

One or more metals may be deposited on the first portion 138 in the recess 134 to form the second portion 140. The second portion 140 may include, for example, low resistivity fill metals. At least one of the metals deposited to form the second portion 140 may have a different chemical composition than a metal deposited to form the first portion 138.

Materials for forming the electrode terminal 142 may include a wide variety of suitable electrically conductive materials including, for example, one or more metals. In some embodiments, the electrode terminal 142 may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. In some embodiments, the electrode terminal 142 may include a metal nitride such as, for example, titanium nitride (TiN), tungsten nitride (WN), or tantalum nitride (TaN), or combinations thereof. In some embodiments, the electrode terminal 142 may include a metal silicide such as, for example, titanium silicide (TiSi), tungsten silicide (WSi), tantalum silicide (TaSi), cobalt silicide (CoSi), platinum silicide (PtSi), nickel silicide (NiSi), or combinations thereof. In some embodiments, the electrode terminal 142 may include a metal silicon nitride such as, for example, titanium silicon nitride (TiSiN), or tantalum silicon nitride (TaSiN), or combinations thereof. In some embodiments, the electrode terminal 142 may include a metal carbide such as, for example, titanium carbide (TiC), zirconium carbide (ZrC), tantalum carbide (TaC), hafnium carbide (HfC), or aluminum carbide (AlC), or combinations thereof. In some embodiments, the electrode terminal 142 may include a metal carbon nitride such as, for example, tantalum carbon nitride (TaCN), titanium carbon nitride (TiCN), or combinations thereof. In some embodiments, the electrode terminal 142 may include conductive metal oxides (e.g., ruthenium oxide). The materials may further include P-type workfunction or N-type workfunction materials depending on whether the transistor is to be a P-type or N-type transistor. In some embodiments, multiple layers of different materials may be used to form the electrode terminal 142. The electrode terminal 142 may include other suitable materials in other embodiments. In some embodiments, the electrode terminal 142 (e.g., second portion 140) may include a dielectric material to facilitate formation of self-aligned contact structures.

In an embodiment where the electrode terminal 142 is a gate terminal, the electrode terminal 142 may have a more rectangular shaped profile relative to the electrode terminal 142 of a source/drain. That is, in some embodiments, the electrode terminal 142 of a gate may have a profile that is more tapered relative to an electrode terminal 142 of a source/drain. The profile of the electrode terminal 142 of a gate may be more rectangular as a result of a patterning process that may be used to form the electrode terminal 142. For example, a replacement metal gate (RMG) process may be used to form the recess 134 such that a dummy gate is first formed using a sacrificial material that is subsequently removed and replaced with another gate material.

In an embodiment where the electrode terminal 142 is a gate terminal, a pair of spacers (not shown) may bracket the electrode terminal 142. The spacers may be formed from a material such as silicon nitride, silicon oxide, silicon carbide, silicon nitride doped with carbon, and silicon oxynitride. Processes for forming spacers are well known in the art and generally include deposition and etching process steps.

In an embodiment where the electrode terminal 142 is a contact terminal for a source/drain of a transistor, the electrode terminal 142 may have a tapered profile shape with a wider dimension at the top and narrower dimension at the bottom. The wider dimension at the top of the electrode terminal 142 may reduce parasitic external resistance (Rext) of the associated transistor and the narrower dimension at the bottom may facilitate scaling to smaller sizes in the transistor regions by providing more space for the transistors. The profile of the electrode terminal 142 may be achieved, for example, by a wet/dry etch patterning process that provides sloped sidewalls in a contact trench formed by the patterning process.

The gate dielectric 136 may include a variety of suitable dielectric materials including high-k materials. In some embodiments, the gate dielectric 136 may include, for example silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. In some embodiments, an annealing process may be carried out on the gate dielectric 136 to improve its quality when a high-k material is used. Other materials may be used in other embodiments for the gate dielectric 136.

The dielectric material 132 may include any of a wide variety of suitable electrically insulative materials including, for example interlayer dielectric (ILD) materials. The dielectric material 132 may be formed using dielectric materials known for their applicability in integrated circuit structures, such as low-k dielectric materials. Examples of dielectric materials that may be used include, but are not limited to, silicon oxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric material 132 may include pores or other voids to further reduce their dielectric constant. The dielectric material 132 may include other suitable materials in other embodiments.

FIGS. 4A-G schematically illustrate a cross-section side view of a transistor electrode assembly 400a from a first perspective and the transistor electrode assembly 400b from a second perspective during various stages of fabrication, in accordance with some embodiments. The transistor electrode assemblies 400a, 400b may comport with embodiments described in connection with the transistor electrode assemblies 300a, 300b of FIG. 3 and vice versa, according to various embodiments.

Figure 4A:
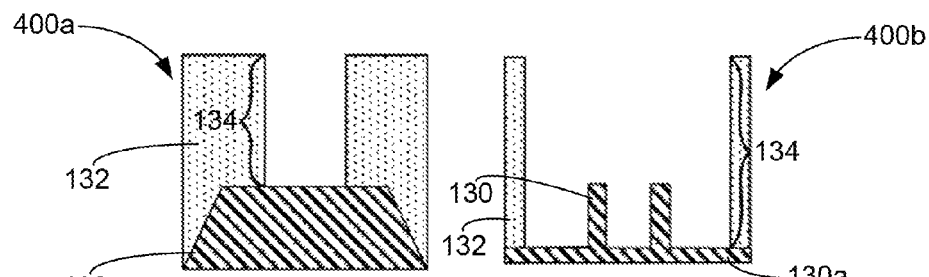
FIGS. 4A-G schematically illustrate a cross-section side view of a transistor electrode assembly from a first perspective and a second perspective during various stages of fabrication, in accordance with some embodiments.

Referring to FIG. 4A, the transistor electrode assemblies 400a, 400b are depicted subsequent to forming a transistor structure 130, depositing a dielectric material 132 over the transistor structure 130 and forming a recess 134 in the dielectric material to expose the transistor structure 130. According to some embodiments, the recess 134 may be formed by forming a sacrificial dummy gate electrode on the transistor structure 130 and then subsequently removing the sacrificial material of the dummy gate electrode as part of a replacement metal gate (RMG) process. The sacrificial material may be removed by an etch process in some embodiments. The RMG process may be used, for example, in a case where the transistor structure 130 is a gate region of a channel body. In such cases, a gate dielectric (e.g., gate dielectric 136 of FIG. 3) may be deposited onto surfaces of the transistor structure 130 and sidewalls in the recess 134 subsequent to forming the recess 134. According to other embodiments, the recess 134 may be formed by removing portions of the dielectric material 132 by patterning processes such as lithography and/or etch processes. Such technique may be used, for example, in cases where the transistor structure 130 is a source or drain region of a transistor.

Figure 4B:
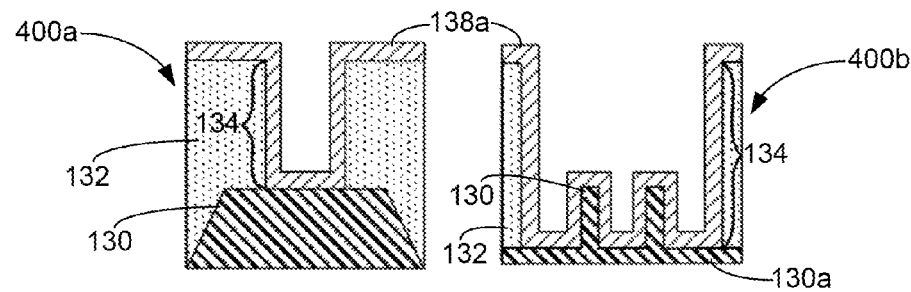

Referring to FIG. 4B, the transistor electrode assemblies 400a, 400b are depicted subsequent to depositing a first metal 138a of a first portion (e.g., first portion 138 of FIG. 3) of an electrode terminal (e.g., electrode terminal 142 of FIG. 3) on the transistor structure 130. In a case where a gate dielectric is formed as part of the transistor structure 130, the first metal 138a may be deposited on the gate dielectric. The first metal 138a may be an interface metal, which may include a workfunction metal in some embodiments. According to various embodiments, the first metal 138a is deposited using a conformal deposition process such as, for example, chemical vapor deposition (CVD), atomic layer deposition (ALD) or physical vapor deposition (PVD) to deposit a substantially uniform thickness of the first metal 138a on exposed surfaces of the transistor electrode assemblies 400a, 400b, as can be seen. Uniform conformal deposition may reduce a likelihood of or prevent pinching off at the top of the opening of the recess 134. Pinching off may result in voids or other defects.

Figure 4C:
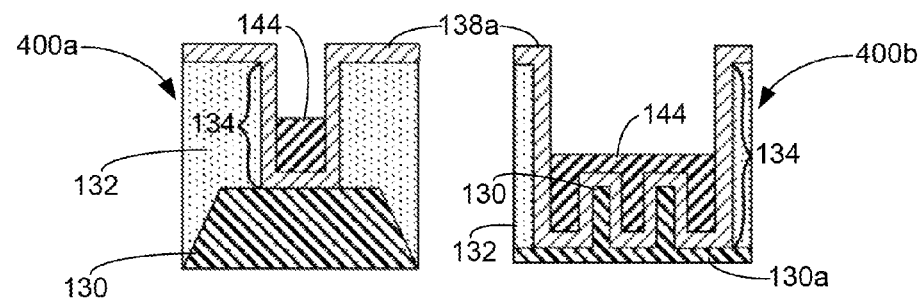

Referring to FIG. 4C, the transistor electrode assemblies 400a, 400b are depicted subsequent to depositing a masking material 144 to fill only a portion of the recess 134, as can be seen. A height of the masking material 144 within the recess 134 may approximately correspond with a height of the first portion within the recess 134. In some embodiments, the masking material 144 may be deposited using any suitable process including, for example, a spin-on process such as spin-on glass (SOG). The masking material 144 may include, for example, a photoresist or hardmask material such as carbon hardmask (CHM). The masking material 144 may include other suitable material and may be deposited using other suitable techniques in other embodiments. In some embodiments, the masking material 144 is etched subsequent to deposition to provide a desired level of the masking material 144 within the recess 134.

Figure 4D:
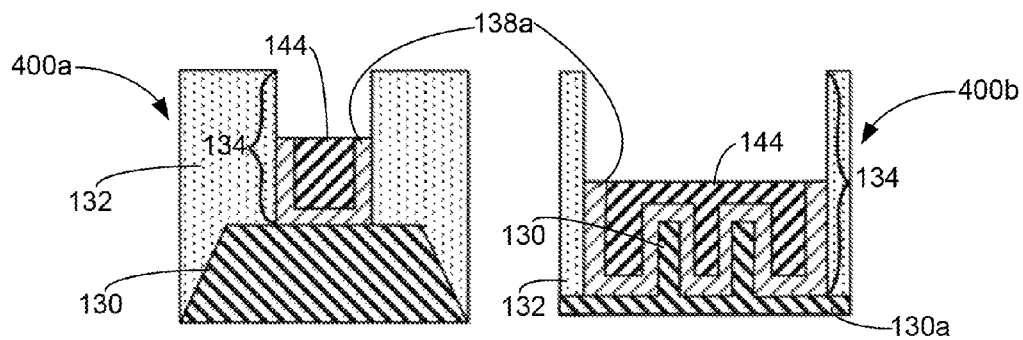

Referring to FIG. 4D, the transistor electrode assemblies 400a, 400b are depicted subsequent to removing portions of the first metal 138a that are not covered or protected by the masking material 144. For example, portions of the first metal 138a on the dielectric material 132 outside of the recess 134 are removed and portions of the first metal 138a within the recess 134 and not covered by the masking material 144 are removed, as can be seen. In some embodiments, the portions of the first metal 138a are removed by an isotropic wet etch process. Other suitable techniques may be used to selectively remove the portions of the first metal 138a in other embodiments.

Figure 4E:
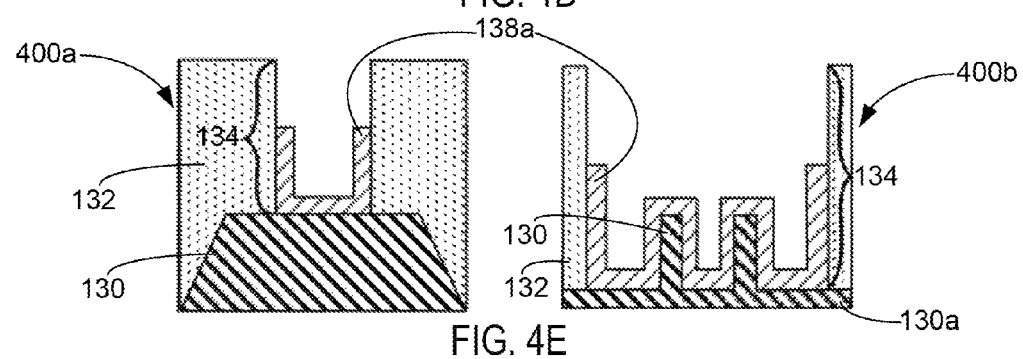

Referring to FIG. 4E, the transistor electrode assemblies 400a, 400b are depicted subsequent to removing the masking material 144. The masking material 144 can be removed using any suitable technique including, for example, etch processes. According to various embodiments, the actions described in connection with FIGS. 4B-E may be repeated one or more times to conformally deposit one or more additional thin films of metal. Generally, for example, sequential ALD metal deposition and metal film recess steps may be performed to fill the bottom of the recess 134 with the first portion 138.

Figure 4F:
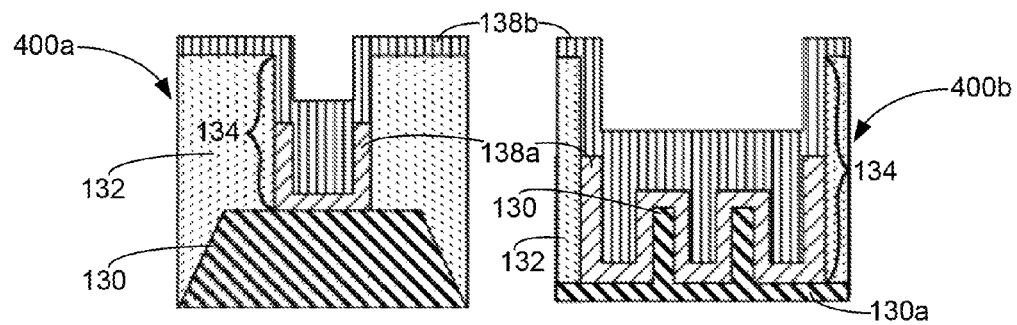

Referring to FIG. 4F, the transistor electrode assemblies 400a, 400b are depicted subsequent to depositing a second metal 138b of the first portion (e.g., first portion 138 of FIG. 3) of the electrode terminal (e.g., electrode terminal 142 of FIG. 3) on an underlying metal such as the first metal 138a. According to various embodiments, the second metal 138b may be deposited by a selective deposition process. For example, in some embodiments, the second metal 138b may be deposited by electroplating, electroless or selective CVD processes. One or more other metals may be further deposited on the second metal 138b by selective deposition in some embodiments. In a case where a selective deposition process is used, then the second metal 138b may fill up the recess to the highest level of the first metal 138a without a need for additional masking and/or etch processes to remove portions of the second metal 138b.

Figure 4G:
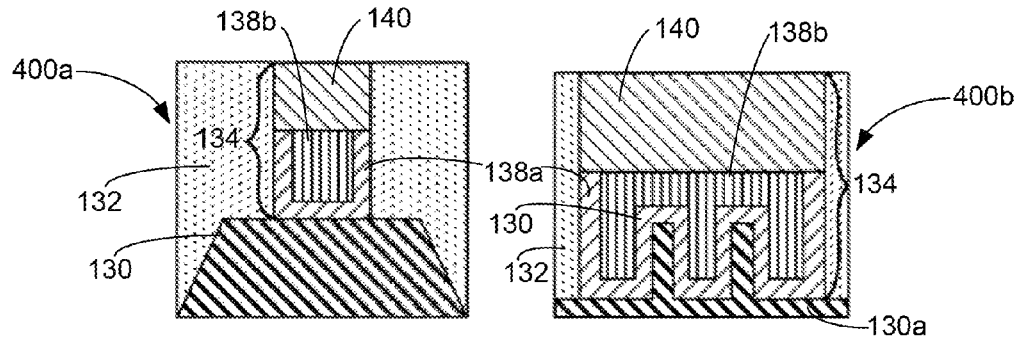

Referring to FIG. 4G, the transistor electrode assemblies 400a, 400b are depicted subsequent to removing portions of the second metal 138b that are above a region where the first metal 138b terminates in the recess 134. In some embodiments, a masking and/or an isotropic wet etch process may be used to remove the portions of the second metal 138b. Other suitable techniques to remove the portions of the second metal 138b may be used in other embodiments. Removal of the portions of the second metal 138b may provide a substantially planar upper surface of the first metal 138a and the second metal 138b across the recess 134, as can be seen. In some embodiments, the first metal 138a may be disposed conformally on surfaces of the transistor structure 130. The second metal 138b may be configured to be in direct contact with a metal that is deposited to form the second portion (e.g., second portion 140 of FIG. 3) at an interface between the first portion (e.g., first portion 138 of FIG. 3) and the second portion. According to various embodiments, a first portion (e.g., first portion 138 of FIG. 3) of the electrode terminal may include the first metal 138a and second metal 138b. Adhesion promoters and/or anti-oxidation materials may be applied to the first metal 138a and/or second metal 138b to increase adhesion of subsequent materials or to protect against oxidation.

In some embodiments, an upper portion of the recess 134 may be filled with one or more metals such as, for example, a low resistivity metal to form a second portion 140 (e.g., second portion 140 of FIG. 3) of the electrode terminal (e.g., electrode terminal 142 of FIG. 3). In some embodiments, material may be deposited using CVD, ALD, PVD, electroless, electroplating, or suitable combinations of these deposition techniques to form the second portion 140. Deposition of the material may be followed by a planarizing or polishing process such as chemical-mechanical polish (CMP) to remove any extraneous material outside of the recess 134.

Although the techniques herein have been described with reference to a transistor structure, similar principles of deposition may be used to deposit metals in narrow recesses in other configurations than depicted. For example, interconnect structures (e.g., trenches or vias) of the interconnect layer 102c of FIG. 2 may be formed using deposition techniques described herein. For example, in some embodiments, the first portion (e.g., first portion 138 of FIG. 3) may be composed of a low resistivity metal and the second portion (e.g., second portion 140 of FIG. 4) may be composed of a dielectric material.

Figure 5:
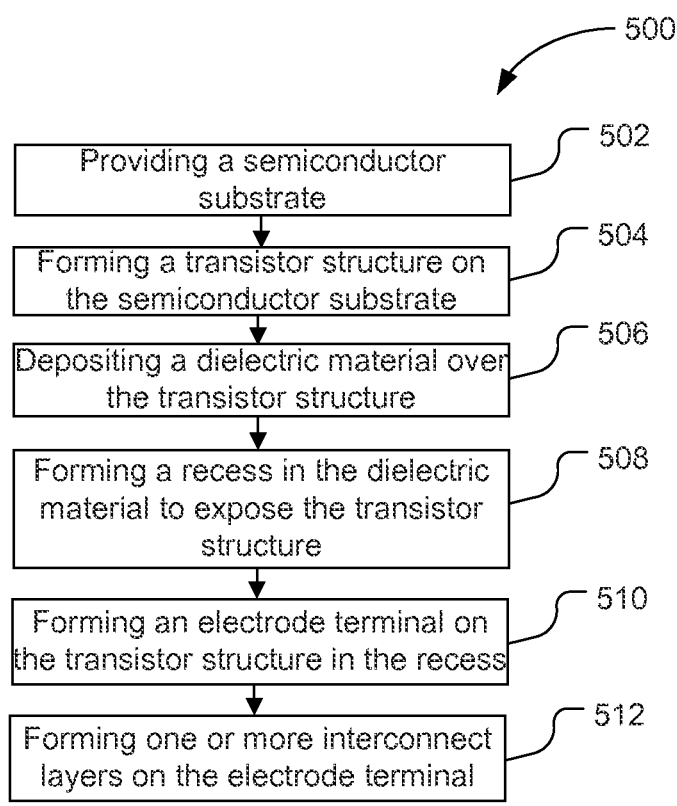
FIG. 5 schematically illustrates a flow diagram for a method of fabricating a transistor electrode assembly, in accordance with some embodiments.

FIG. 5 schematically illustrates a flow diagram for a method 500 of fabricating a transistor electrode assembly (e.g., transistor electrode assemblies 300a, 300b of FIG. 3 or 400a, 400b of FIG. 4), in accordance with some embodiments. The method 500 may comport with embodiments described in connection with FIGS. 1-4G and vice versa.

At 502, the method 500 may include providing a semiconductor substrate (e.g., semiconductor substrate 130a of FIG. 3, FIGS. 4A-G). For example, the semiconductor substrate may include a silicon-based die in wafer form.

At 504, the method 500 may include forming a transistor structure (e.g., transistor structure 130 of FIG. 3, FIGS. 4A-G) on the semiconductor substrate. The transistor structure may be composed of semiconductor material in some embodiments. In some embodiments, the transistor structure may be a gate, source or drain of a transistor. In some embodiments, the transistor structure may include one or more fin structures. The transistor structure may include any other suitable structure of an active device that is coupled to electrical energy by way of an electrode terminal.

At 506, the method 500 may include depositing a dielectric material (e.g., dielectric material 132 of FIG. 3, FIGS. 4A-G) over the transistor structure. The dielectric material may include an ILD material.

At 508, the method 500 may include forming a recess (e.g., recess 134 of FIG. 3, FIGS. 4A-G) in the dielectric material to expose the transistor structure. In some embodiments, the recess may be formed by removing a sacrificial material (e.g., polysilicon) that may be formed on the transistor structure according to well-known processes. For example, the sacrificial material may be removed using an etch process. In other embodiments, the dielectric material may be removed using patterning processes to form the recess.

At 510, the method 500 may include forming an electrode terminal (e.g., electrode terminal 142 of FIG. 3) on the transistor structure in the recess. The electrode terminal may include a first portion (e.g., first portion 138 of FIG. 3) and a second portion (e.g., second portion 140 of FIG. 3). An interface between the first portion and the second portion may be planar and extend across the recess.

In some embodiments, a first portion of the electrode terminal may be formed according to techniques described in connection with FIGS. 4A-G. For example, a first metal (e.g., first metal 138a of FIG. 4B) may be conformally deposited on the transistor structure and on sidewalls of the dielectric material in the recess. A masking material (e.g., masking material 144 of FIG. 4C) may be deposited to cover the first metal that is disposed on the transistor structure and to partially fill the height of the recess. Portions of the first metal that are not covered by the masking material may be removed as described in connection with FIG. 4D and the masking material may be removed as described in connection with FIG. 4E. In some embodiments, forming the first portion may further include selectively depositing another metal (e.g., second metal 138b of FIG. 4F) on the first metal and removing portions of the other metal that are above a point in the recess where the first metal terminates as described in connection with FIG. 4G.

The second portion of the electrode terminal may be formed by depositing another metal or suitable material on the substantially planar surface of the first portion. Excess material of the second portion may be removed using a polishing process.

At 512, the method 500 may further include forming one or more interconnect layers (e.g., interconnect layer 102c of FIG. 2) on the electrode terminal. The interconnect layer may include electrically conductive structures that are configured to route electrical energy to or from the electrode terminal.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 6:
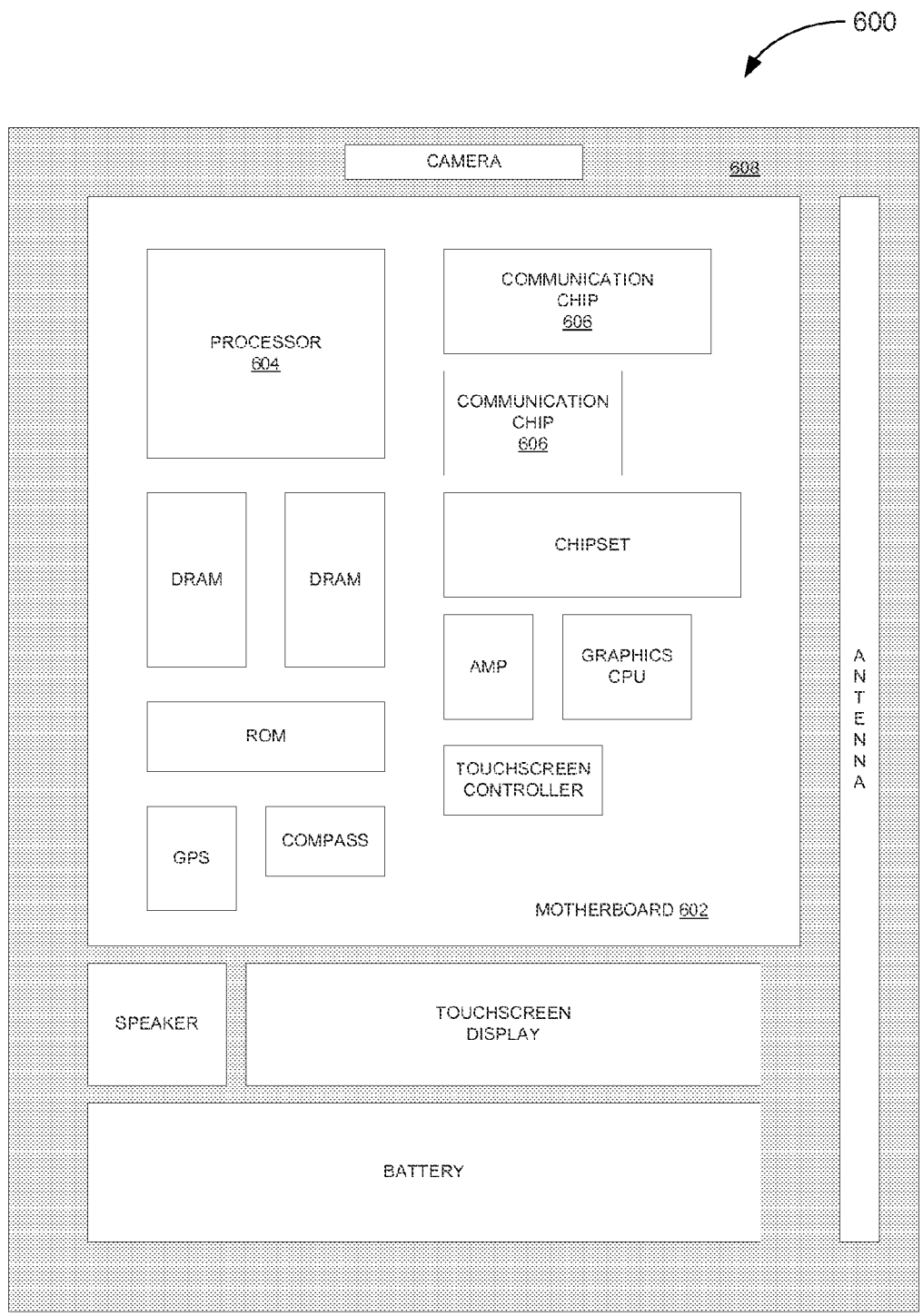
FIG. 6 schematically illustrates an example system that may include a transistor electrode assembly as described herein, in accordance with some embodiments.

FIG. 6 schematically illustrates an example system (e.g., computing device 600) that may include a transistor electrode assembly (e.g., transistor electrode assembly 300a, 300b of FIG. 3 or 400a, 400b of FIG. 4) as described herein, in accordance with some embodiments. Components of the computing device 600 may be housed in an enclosure (e.g., housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may include a die (e.g., die 102 of FIGS. 1-2) having a transistor electrode assembly (e.g., transistor electrode assembly 300a, 300b of FIG. 3 or 400a, 400b of FIG. 4) as described herein. For example, the die 102 of FIGS. 1-2 may be mounted in a package assembly that is mounted on a circuit board such as the motherboard 602. The term "processor" may refer to any device or portion of a device that processes electronic data from registers and/or memory to transform that electronic data into other electronic data that may be stored in registers and/or memory.

The communication chip 606 may also include a die (e.g., die 102 of FIGS. 1-2) having a transistor electrode assembly (e.g., transistor electrode assembly 300a, 300b of FIG. 3 or 400a, 400b of FIG. 4) as described herein. In further implementations, another component (e.g., memory device or other integrated circuit device) housed within the computing device 600 may contain a die (e.g., die 102 of FIGS. 1-2) having a transistor electrode assembly (e.g., transistor electrode assembly 300a, 300b of FIG. 3 or 400a, 400b of FIG. 4) as described herein.

In various implementations, the computing device 600 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

According to various embodiments, the present disclosure describes an apparatus (e.g., transistor electrode assembly). Example 1 of an apparatus may include a transistor structure comprising a semiconductor material, a dielectric material having a recess defined over the transistor structure, the recess having a height in a first direction, an electrode terminal disposed in the recess and coupled with the transistor structure, wherein a first portion of the electrode terminal comprises a first metal in direct contact with the transistor structure and a second portion of the electrode terminal comprises a second metal disposed on the first portion and wherein an interface between the first portion and the second portion is planar and extends across the recess in a second direction that is substantially perpendicular to the first direction. Example 2 may include the apparatus of Example 1, wherein the transistor structure comprises a gate comprising the semiconductor material and a gate dielectric formed on the gate, wherein the first metal is in direct contact with the gate dielectric. Example 3 may include the apparatus of Example 2, wherein the first metal is a workfunction metal and the second metal has a different chemical composition than the first metal. Example 4 may include the apparatus of Example 1, wherein the transistor structure comprises a source or drain. Example 5 may include the apparatus of any of Examples 1-4, wherein the transistor structure comprises one or more fin structures. Example 6 may include the apparatus of Example 5, wherein the first portion of the electrode terminal covers surfaces of the one or more fin structures within the recess. Example 7 may include the apparatus of any of Examples 1-4, wherein the first metal is disposed conformally on surfaces of the transistor structure, the first portion includes a third metal disposed on the first metal, and the third metal is in direct contact with the second metal at the interface between the first portion and the second portion. Example 8 may include the apparatus of any of Examples 1-4, wherein a critical dimension across the recess in the second direction is less than or equal to 15 nanometers (nm) and an aspect ratio of the height of the recess relative to the critical dimension is greater than or equal to 2:1.

According to various embodiments, the present disclosure describes a method (e.g., of fabricating an IC structure). Example 9 of a method may include forming a transistor structure comprising a semiconductor material, depositing a dielectric material over the transistor structure, forming a recess in the dielectric material to expose the transistor structure, the recess having a height in a first direction and forming an electrode terminal in the recess, the electrode terminal being coupled with the transistor structure, wherein a first portion of the electrode terminal comprises a first metal in direct contact with the transistor structure and a second portion of the electrode terminal comprises a second metal disposed on the first portion and wherein an interface between the first portion and the second portion is planar and extends across the recess in a second direction that is substantially perpendicular to the first direction. Example 10 may include the method of Example 9, wherein forming the transistor structure comprises forming a gate, source or drain. Example 11 may include the method of Example 9, wherein forming the transistor structure comprises forming one or more fin structures. Example 12 may include the method of any of Examples 9-11, wherein forming the recess in the dielectric material comprises removing a sacrificial material disposed on the transistor structure. Example 13 may include the method of any of Examples 9-11, wherein forming the electrode terminal comprises forming the first portion by depositing the first metal on the transistor structure and on sidewalls of the dielectric material in the recess, depositing a masking material to cover the first metal that is disposed on the transistor structure and to partially fill the height of the recess, removing portions of the first metal that are not covered by the masking material and removing the masking material and forming the second portion by depositing the second metal on the first portion. Example 14 may include the method of Example 13, wherein forming the first portion further comprises selectively depositing a third metal on the first metal and removing portions of the third metal, wherein depositing the first metal comprises conformally depositing the first metal on the transistor structure and on the sidewalls. Example 15 may include the method of any of Examples 9-11, further comprising removing excess material of the second portion using a polishing process.

According to various embodiments, the present disclosure describes a system (e.g., a computing device). Example 16 of a computing device may include a circuit board and a die coupled with the circuit board, the die including a transistor structure comprising a semiconductor material, a dielectric material having a recess defined over the transistor structure, the recess having a height in a first direction, an electrode terminal disposed in the recess and coupled with the transistor structure, wherein a first portion of the electrode terminal comprises a first metal in direct contact with the transistor structure and a second portion of the electrode terminal comprises a second metal disposed on the first portion and wherein an interface between the first portion and the second portion is planar and extends across the recess in a second direction that is substantially perpendicular to the first direction. Example 17 may include the computing device of Example 16, wherein the transistor structure comprises one or more fin structures. Example 18 may include the computing device of Example 16, wherein the first metal is disposed conformally on surfaces of the transistor structure, the first portion includes a third metal disposed on the first metal, and the third metal is in direct contact with the second metal at the interface between the first portion and the second portion. Example 19 may include the computing device of Example 16, wherein a critical dimension across the recess in the second direction is less than or equal to 15 nanometers (nm) and an aspect ratio of the height of the recess relative to the critical dimension is greater than or equal to 2:1. Example 20 may include the computing device of any of Examples 16-19, wherein the die is a processor and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a transistor structure comprising a semiconductor material;
   a dielectric material having a recess defined over the transistor structure, the recess having a height in a first direction; and
   an electrode terminal located in the recess and coupled with the transistor structure, wherein a first portion of the electrode terminal comprises a first metal in direct contact with the transistor structure and a second portion of the electrode terminal comprises a second metal located on the first portion, wherein an interface between the first portion and the second portion is planar and extends across the recess from the dielectric material located at a first side of the recess to the dielectric material located at a second side of the recess, the second side located opposite to the first side, in a second direction that is substantially perpendicular to the first direction.

2. The apparatus of claim 1, wherein the transistor structure comprises:
   a gate comprising the semiconductor material; and
   a gate dielectric located on the gate, wherein the first metal is in direct contact with the gate dielectric.

3. The apparatus of claim 1, wherein the transistor structure comprises a source or drain.

4. The apparatus of claim 1, wherein the transistor structure comprises one or more fin structures.

5. The apparatus of claim 1, wherein:
   the first metal is located conformally on surfaces of the transistor structure;
   the first portion includes a third metal located on the first metal; and
   the third metal is in direct contact with the second metal at the interface between the first portion and the second portion.

6. The apparatus of claim 1, wherein:
   a critical dimension across the recess in the second direction is less than or equal to 15 nanometers (nm); and
   an aspect ratio of the height of the recess relative to the critical dimension is greater than or equal to 2:1.

7. The apparatus of claim 2, wherein the first metal is a workfunction metal and the second metal has a different chemical composition than the first metal.

8. The apparatus of claim 4, wherein the first portion of the electrode terminal covers surfaces of the one or more fin structures within the recess.

9. A method of fabricating an integrated circuit (IC) structure, the method comprising:
   forming a transistor structure comprising a semiconductor material;
   depositing a dielectric material over the transistor structure;
   forming a recess in the dielectric material to expose the transistor structure, the recess having a height in a first direction; and
   forming an electrode terminal in the recess, the electrode terminal being coupled with the transistor structure, wherein a first portion of the electrode terminal comprises a first metal in direct contact with the transistor structure and a second portion of the electrode terminal comprises a second metal disposed on the first portion and wherein an interface between the first portion and the second portion is planar and extends across the recess from the dielectric material located at a first side of the recess to the dielectric material located at a second side of the recess, the second side located opposite to the first side, in a second direction that is substantially perpendicular to the first direction.

10. The method of claim 9, wherein forming the transistor structure comprises forming a gate, source or drain.

11. The method of claim 9, wherein forming the transistor structure comprises forming one or more fin structures.

12. The method of claim 9, wherein forming the recess in the dielectric material comprises removing a sacrificial material disposed on the transistor structure.

13. The method of claim 9, wherein forming the electrode terminal comprises:
   forming the first portion by:
     depositing the first metal on the transistor structure and on sidewalls of the dielectric material in the recess;

depositing a masking material to cover the first metal that is disposed on the transistor structure and to partially fill the height of the recess;

removing portions of the first metal that are not covered by the masking material; and removing the masking material; and forming the second portion by:

depositing the second metal on the first portion.

14. The method of claim 13, wherein forming the first portion further comprises:

selectively depositing a third metal on the first metal; and removing portions of the third metal, wherein depositing the first metal comprises conformally depositing the first metal on the transistor structure and on the sidewalls.

15. The method of claim 9, further comprising:

removing excess material of the second portion using a polishing process.

16. A computing device comprising:

a circuit board; and a die coupled with the circuit board, the die including:

a transistor structure comprising a semiconductor material;

a dielectric material having a recess defined over the transistor structure, the recess having a height in a first direction; and an electrode terminal located in the recess and coupled with the transistor structure, wherein a first portion of the electrode terminal comprises a first metal in direct contact with the transistor structure and a second portion of the electrode terminal comprises a second metal located on the first portion and wherein an interface between the first portion and the second portion is planar and extends across the recess from the dielectric material located at a first side of the recess to the dielectric material located at a second side of the recess, the second side located opposite to the first side, in a second direction that is substantially perpendicular to the first direction.

17. The computing device of claim 16, wherein the transistor structure comprises one or more fin structures.

18. The computing device of claim 16, wherein:

the first metal is located conformally on surfaces of the transistor structure;

the first portion includes a third metal located on the first metal; and the third metal is in direct contact with the second metal at the interface between the first portion and the second portion.

19. The computing device of claim 16, wherein:

a critical dimension across the recess in the second direction is less than or equal to 15 nanometers (nm); and an aspect ratio of the height of the recess relative to the critical dimension is greater than or equal to 2:1.

20. The computing device of claim 16, wherein:

the die is a processor; and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

* * * * *